United States Patent
Suzuki

[11] Patent Number: 6,080,679
[45] Date of Patent: Jun. 27, 2000

[54] HIGH-SPEED SOFT EVACUATION PROCESS AND SYSTEM

[75] Inventor: Nobumasa Suzuki, Yokohama, Japan

[73] Assignee: Canon Kabushiki Kaisha, Tokyo, Japan

[21] Appl. No.: 09/081,021

[22] Filed: May 19, 1998

[30] Foreign Application Priority Data

May 23, 1997 [JP] Japan ..................... 9-133525
Apr. 14, 1998 [JP] Japan ..................... 10-102611

[51] Int. Cl.[7] .................. C23F 1/02; F16G 5/00
[52] U.S. Cl. .............. 438/726; 141/65; 141/66; 141/8; 118/715; 118/719; 156/345
[58] Field of Search .............. 156/345; 118/715, 118/719; 204/298; 141/65, 66, 8

[56] References Cited

U.S. PATENT DOCUMENTS

| | | | |
|---|---|---|---|
| 5,223,001 | 6/1993 | Saeki ..................... | 29/25.01 |
| 5,223,039 | 6/1993 | Suzuki ..................... | 118/723 |
| 5,242,539 | 9/1993 | Kumihashi et al. ..................... | 156/643 |
| 5,340,460 | 8/1994 | Kobayashi et al. ..................... | 204/298.09 |
| 5,433,238 | 7/1995 | Cannizzaro et al. ..................... | 137/14 |
| 5,538,699 | 7/1996 | Suzuki ..................... | 422/186.29 |
| 5,556,473 | 9/1996 | Olson et al. ..................... | 118/719 |
| 5,803,975 | 9/1998 | Suzuki ..................... | 118/723 MW |
| 5,951,835 | 9/1999 | Namiki et al. ..................... | 204/298.24 |
| 5,981,399 | 11/1999 | Kawamura et al. ..................... | 438/715 |

FOREIGN PATENT DOCUMENTS

| | | |
|---|---|---|
| 58-98916 | 6/1983 | Japan . |
| 1-302719 | 12/1989 | Japan . |
| 3-157585 | 7/1991 | Japan . |
| 3-116413 | 12/1991 | Japan . |
| 4-196313 | 7/1992 | Japan . |

*Primary Examiner*—Robert J Warden, Sr.
*Assistant Examiner*—Monique R Jackson
*Attorney, Agent, or Firm*—Fitzpatrick, Cella, Harper & Scinto

[57] ABSTRACT

A process for evacuating the inside of a vacuum vessel before a processing gas is introduced into the vacuum vessel. The process includes steps of evacuating the inside of the vacuum vessel through a by-pass evacuation path such that a pressure reduction rate of the pressure inside the vacuum vessel is gradually reduced immediately after the start of evacuation, and opening an evacuation conductance control valve, provided in a principal evacuation path, during or after the evacuation step such that conductance of the evacuation conductance control valve is gradually increased with an elapse of evacuation time. The timing at which the evacuation conductance control valve is started to be opened is controlled so that a pressure reduction rate curve of the pressure inside the vacuum vessel has a minimum value and a maximum value. The minimum value becomes 0.2 times or more a value given immediately after the start of evacuation and the maximum value becomes not greater than the value given immediately after the start of evacuation.

30 Claims, 11 Drawing Sheets

6,080,679

HIGH-SPEED SOFT EVACUATION PROCESS AND SYSTEM

BACKGROUND OF THE INVENTION

1. Field of the Invention

This invention belongs to a technical field of evacuation processes used in vacuum systems such as semiconductor device fabrication systems. More particularly, it belongs to a technical field of evacuation processes and systems for realizing high-speed soft evacuation, that can shorten evacuation time while controlling the movement of particles.

2. Related Background Art

Various vacuum systems are used in the fabrication of semiconductor devices, electric circuits and so forth. As thin-film forming systems, LPCVD (low-pressure chemical vapor deposition) systems are used to form $Si_3N_4$ films for LOCOS masks and poly-Si (polycrystalline silicon) films for gate electrodes; plasma enhanced CVD systems, to form $SiO_2$ films for interlayer insulation and SiN films for final protection; and sputtering systems, to form aluminum thin films for wiring. Besides, vacuum systems such as ion implantation systems, plasma etching systems and photoresist ashing systems are put into wide use.

FIG. 16 illustrates a block diagram of an evacuation system commonly used in load-lock type vacuum systems. Reference numeral 601 denotes a reactor in which the processing is carried out; 602, a high-vacuum pump such as a turbo-molecular pump, a cryopump, a diffusion pump or an adsorption pump; 603, a low-vacuum pump such as a dry pump or a rotary pump; 604, a roughing valve for evacuating the inside of the reactor 601 in the state of atmospheric pressure; 605, an evacuation conductance control valve; 606, a main-evacuation valve for performing main evacuation after the roughing; 607, a pump-to-pump valve provided between the high-vacuum pump 602 and the low-vacuum pump 603; 611, a load-lock chamber; 612, an evacuation pump for evacuating the inside of the load-lock chamber; 613, a gate valve for intercepting the passage between the reactor 601 and the load-lock chamber 611; and 614, an evacuation valve through which the inside of the load-lock chamber is evacuated.

The vacuum system as shown in FIG. 16 is operated in the following way to carry out evacuation and processing. First, keeping the valve 605 always open, the low-vacuum pump 603 is actuated to open the pump-to-pump valve 607, and thereafter the high-vacuum pump 602 is actuated. After the pump-to-pump valve 607 is closed, the roughing valve 604 is opened. Thus, the inside of the reactor 601 is started to be evacuated in the state of atmospheric pressure. After the reactor 601 has been evacuated until its internal pressure comes within the pressure range with which the high-vacuum pump 602 can operate for evacuation, the roughing valve 604 is closed and then the pump-to-pump valve 607 and the main-evacuation valve 606 are successively opened to initiate main evacuation. Usually, this state is kept except when the system is checked for maintenance. After a gate valve 613 is opened, a cassette holding a plurality of processing substrates is transported into the load-lock chamber 611. After the gate valve 615 is closed and the vacuum pump 612 is actuated, the evacuation valve 614 is opened. Thus, the inside of the load-lock chamber 611 is started to be evacuated in the state of atmospheric pressure until it has a reduced pressure. After the inside of the load-lock chamber 611 has been evacuated to a pressure low enough not to adversely affect the reactor 601, the gate valve 613 is opened to transport into the reactor 601 the substrates held in the cassette, and then the gate valve 613 is closed to carry out processing. During this processing, gases are introduced into the reactor from a processing gas feed system 616, and the pressure inside the reactor 601 is kept at a predetermined value by adjusting the conductance of the evacuation conductance control valve 605. After the processing is completed, the gate valve 613 is opened, and the substrate having been processed is put into the cassette left in the load-lock chamber 611 from the reactor 601, whereby the next substrate is transported into the reactor 601. After all the substrates have been processed, the evacuation valve 614 is closed to return the internal pressure of the load-lock chamber 611 to atmospheric pressure, and the cassette is taken out.

FIG. 17 illustrates a block diagram of an evacuation system commonly used in open-to-air type vacuum systems. Reference numeral 701 denotes a reactor in which the processing is carried out; 703, a vacuum pump; 704, a roughing valve for evacuating the inside of the reactor 701 in the state of atmospheric pressure; 705, an evacuation conductance control valve; 706, a main-evacuation valve for performing main evacuation after the roughing.

The vacuum system as shown in FIG. 17 is operated in the following way to carry out evacuation and processing. First, keeping the valve 705 always open, the evacuation pump 703 is actuated. After a gate valve 715 is opened, a processing substrate is transported into the reactor 701. The roughing valve 704 is opened. Thus, the inside of the reactor 701 is started to be evacuated in the state of atmospheric pressure. After the inside of the reactor 701 has been well evacuated, the roughing valve 704 is closed and then the main-evacuation valve 706 is opened to initiate main evacuation. During this processing, gases are introduced into the reactor from a processing gas feed system 716, and the pressure inside the reactor 701 is kept at a predetermined value by adjusting the conductance of the evacuation conductance control valve 705. After the processing is completed, the main-evacuation valve 706 is closed to return the internal pressure of the reactor 701 to atmospheric pressure, whereby the substrate is taken out, and the next substrate is put into the reactor.

In both of the load-lock type and open-to-air type vacuum systems, the evacuation conductance control valve 605 or 705 is set always to stand open (normally open) except when processing gases are introduced into the reactor, a vacuum vessel, and the pressure inside the vacuum vessel is maintained at a predetermined value, and the valve 605 or 705 is set to stand at a maximum conductance.

Accordingly, when the vacuum vessel is evacuated before the processing gases are introduced into the vacuum vessel, the evacuation is operated by only switching the open-close valves 604 and 606 or 704 and 706 to bring the reactor into the state of interception or the state of communication.

When processing objects (substrates) are processed in the vacuum vessel having been evacuated, using the evacuation system of the vacuum system shown in FIG. 16 or 17, it has not been easy to improve processing yield.

As a result of investigation on the cause, it became clear that particles adhering to processing objects in the vacuum system hindered the improvement in yield. As a countermeasure therefor, the inside of the vacuum vessel was cleaned, but the yield again began to decrease with progress in the processing. Accordingly, how the particles behaved was observed. As a result, it became clear that the particles, having stood still in the vacuum vessel when its inside was evacuated before the processing gases were introduced into the vacuum vessel, moved as if they flew up, and adhered to the processing objects.

The particles greatly fly up especially when the roughing is completed in a short time so as to shorten evacuation time and then the main evacuation is carried out. This is due to a great change in pressure at the time of the main evacuation.

If in order to control such movement of particles the main evacuation is started after the roughing is carried out for a long time to provide a sufficiently low pressure, it takes a long time for the evacuation in total, resulting in a low processing throughput for the processing objects. This greatly affects the vacuum system when it is the open-to-air type system the inside of the vacuum vessel of which is made open to atmosphere every time the processing object is put in and out, as utilized, e.g., in most ashing systems.

SUMMARY OF THE INVENTION

An object of the present invention is to provide an evacuation process of a vacuum vessel, and an evacuation system, that can hinder the particles from moving inside the vacuum vessel and can improve processing yield on processing objects (such as substrates).

Another object of the present invention is to provide an evacuation process of a vacuum vessel, and an evacuation system, that can shorten the evacuation time without excessively increasing the pressure reduction rate.

The present invention provides a process, and a system, for evacuating the inside of a vacuum vessel before a processing gas is introduced into the vacuum vessel, wherein the conductance of an evacuation conductance control valve is gradually increased with a lapse of evacuation time.

DESCRIPTION OF THE PREFERRED EMBODIMENTS

The system for evacuating a vacuum vessel according to an embodiment of the present invention will be described.

Figure 1:
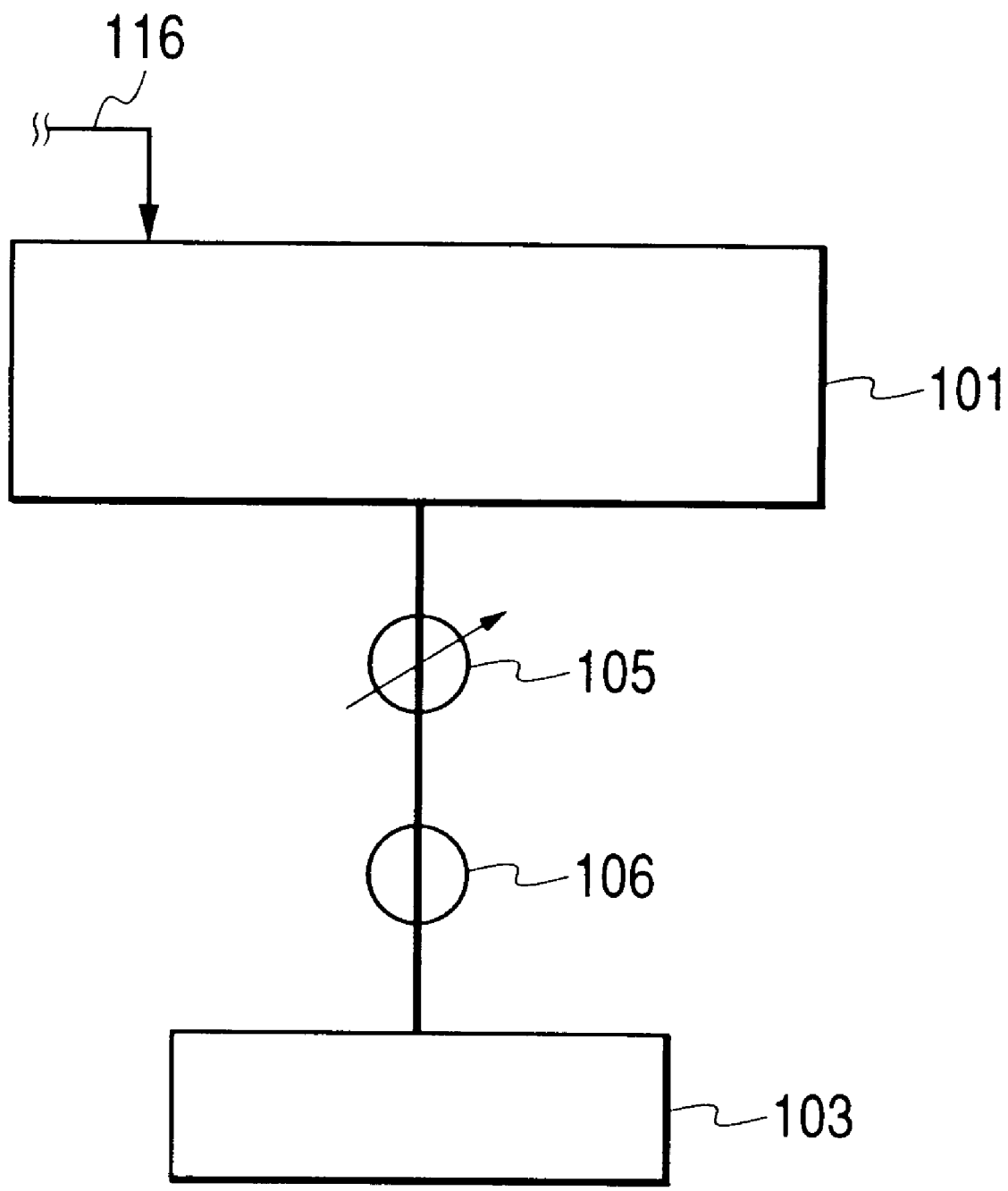
FIG. 1 is a diagrammatic illustration of an evacuation system according to an embodiment of the present invention.

In FIG. 1, reference numeral 101 denotes a reactor serving as the vacuum vessel; 116, a processing gas introducing means for introducing processing gases to the reactor 101. Before the processing gases are introduced, the inside of the reactor 101 is evacuated by means of an evacuation system (103, 105, 106).

This evacuation system has an evacuation conductance control valve 105. The conductance of this valve 105 is gradually increased with an elapse of evacuation time.

Here, reference numeral 106 denotes an evacuation valve; and 103, an evacuation vacuum pump such as a turbomolecular pump, a cryopump, an oil-diffusion pump or a rotary pump.

The vacuum system as shown in FIG. 1 is operated in the following way to carry out evacuation and processing. First, the vacuum pump 103 is actuated. A processing object placed outside the reactor 101 is transported into the reactor 101. After the evacuation conductance control valve 105 is set full-closed (a state where the conductance is made minimum), the evacuation valve 106 is opened. Then, the valve 105 is gradually opened so that the inside of the reactor 101 is started to be evacuated in the state of atmospheric pressure so as to gradually become low in pressure. The conductance of the evacuation conductance control valve 105 may preferably be continuously increased so as to substantially come to be $C(t)=V/(t_1-t)$. Here, $C(t)$ is conductance, $V$ is the volume of the vacuum vessel, $t_1$ is evacuation target time, and $t$ is evacuation time.

In this way, the change with time of the pressure inside the vacuum vessel, i.e., pressure reduction rate can be kept constant for a predetermined period.

After a sufficient degree of vacuum is produced, processing gases are introduced into the reactor 101 from the processing gas introducing means 116 to process the processing object. After the processing is completed, the evacuation valve 106 is closed, and the reactor 101 is set open to return the internal pressure of the reactor 101 to atmospheric pressure, where the processing object is taken out, and the next processing object is put into the reactor.

Figure 2:
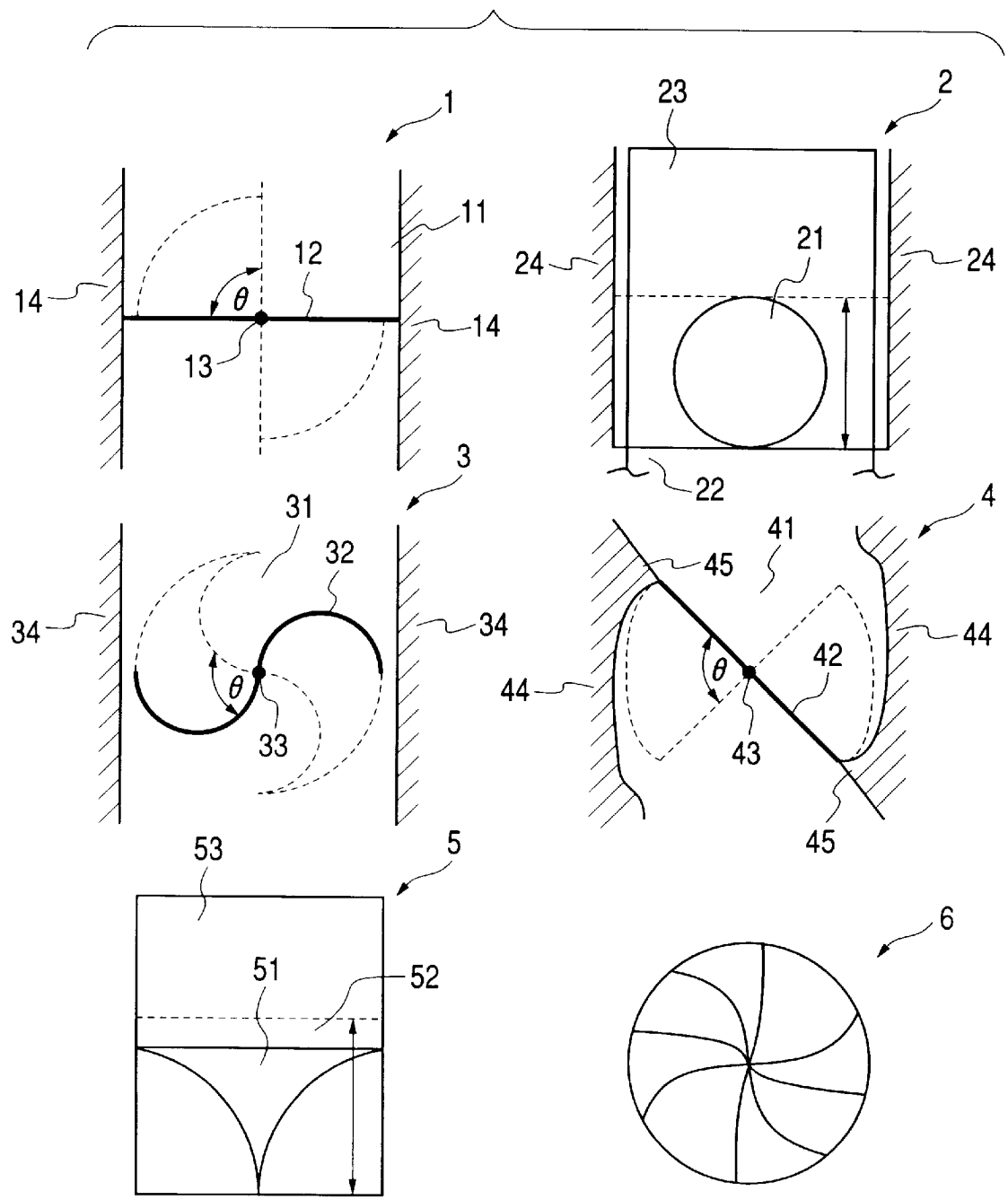
FIG. 2 is a diagrammatic illustration of structures of various evacuation conductance control valves used in the present invention.

Examples of the evacuation conductance control valve 105 used in the present invention are shown in FIG. 2. Reference numeral 1 denotes a rotation angular-velocity control type valve; 2, a valve element moving-speed control type valve; 3, a curved valve element type valve; 4, a curved-wall type valve; 5, a gradually enlarged opening type valve; and 6, an iris diaphragm type valve.

The rotation angular-velocity control type valve 1 has a flow-path wall 14 that forms a flow path 11, and a plate-like movable valve element 12. The movable valve element 12 is rotatable at 90 degrees around a shaft 13. In FIG. 1, a full-closed state ($\theta=0$) is shown. The valve stands full-open when $\theta=90$ degrees. The conductance can be gradually increased by rotating the valve element 12 while adjusting the rotational angle $\theta$ of the movable valve element 12 by means of, e.g., a stepping motor connected to the movable valve element.

The valve element moving-speed control type valve 2 has a flow-path forming member 23 having a circular opening in a flow path formed by a wall 24. Inside the flow-path forming member 23, an up-and-down movable valve element 22 is provided so that the conductance of the opening 21 can be changed when the top of the valve element 22 is up and down moved within the range shown by an arrow in the drawing. The conductance can be gradually increased by gradually moving the valve element 22 downward by means of a drive mechanism (not shown).

The curved valve element type valve 3 is provided with a curved valve element 32 having an S-shaped cross section, in the course of a flow path 31 formed by a flow-path wall 34, and is rotated around a shaft 33, like the above valve 1. When this valve 3 stands closed, the valve element 32 does not come into contact with the flow-path wall 34 so that gases can flow in a trace quantity also when the valve is closed. Also, the conductance in the full-open state is smaller than that of the valve 1.

The curved-wall type valve 4 has a flow-path wall 44 having a convex portion 45 in the wall, and a flat plate-like movable valve element 42 attached to a shaft 43. The conductance in the full-closed state is 0 (zero). The conductance increases in a small amount in the course where the rotational angle $\theta$ ranges from 0 degrees to 90 degrees, and abruptly increases when the rotational angle $\theta$ becomes greater than 90 degrees.

The gradually enlarged opening type valve 5 has a flow-path forming member 53 having an opening 51, and a valve element 52 provided in its inside. The lower end of the valve element 52 is up and down movable within the range shown by an arrow in the drawing. The conductance of the opening 51 gradually increases with an elevation of the lower end.

The iris diaphragm type valve 6 can form an opening formed at the center and its vicinity. The conductance of the opening gradually increases with a gradual enlargement of the opening. In any type of valve, it is preferable that the open-close (movement) amount of a valve element is electrically controlled by a stepping motor or the like.

Figure 3A:
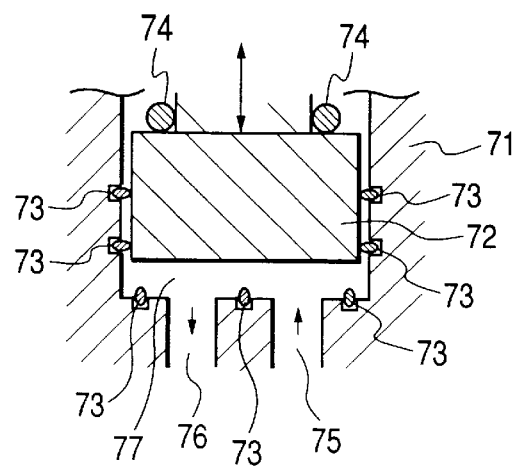
FIGS. 3A and 3B are diagrammatic illustrations of structures of binarily controllable evacuation valves.
Figure 3B:
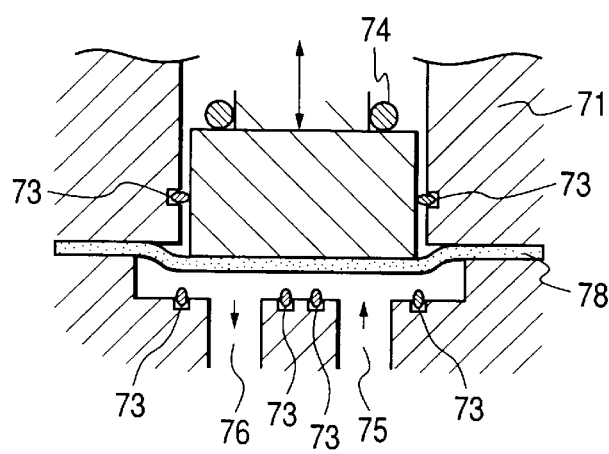

FIGS. 3A and 3B show examples of valves usable in the evacuation valve 106. This valve has a conductance of only two values, a minimum value (0) and a maximum value.

In the flow-path wall 71, an inlet flow path 75, an outlet flow path 76 and a communicating path 77 are formed, and a movable valve element 72 is provided via an O-ring 73. The valve element 72 is ascended against the pressing force of a spring 74 by the aid of, e.g., an electromagnetic coil (not shown), where the conductance becomes maximum, and the valve element 72 is descended when the coil is set off, where the conductance becomes 0.

The valve may optionally have a structure wherein a flexible diaphragm 78 is provided beneath the valve element 72 so that any leak that may occur in the full-closed state can be prevented. Its example is as shown in FIG. 3B.

Figure 4:
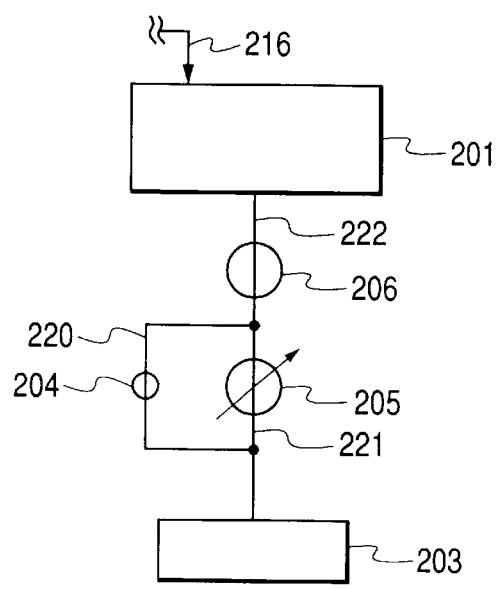
FIG. 4 is a diagrammatic illustration of an evacuation system according to another embodiment of the present invention.

FIG. 4 shows an example of the evacuation system according to another embodiment of the present invention.

In FIG. 4, reference numeral 201 denotes a reactor serving as the vacuum vessel; 216, a processing gas introducing means for introducing processing gases into the reactor 201. Before the processing gases are introduced by this processing gas introducing means, the inside of the reactor 201 is evacuated by means of an evacuation system (203, 204, 205, 206).

Reference numeral 203 denotes an evacuation vacuum pump like the pump 103 previously described; 204, a by-pass evacuation valve provided in a by-pass evacuation path 220; 205, an evacuation conductance control valve provided in a principal evacuation path 221; and 206, an evacuation valve provided in an evacuation path 222.

As the by-pass evacuation valve 204 and the evacuation valve 206, valves may preferably be used which are binarily controllable into an open state and a closed state as shown in FIGS. 3A and 3B. As the evacuation conductance control valve, valves may preferably be used as shown. The conductance of the by-pass evacuation valve 204 at the time the valve 204 stands open is smaller than the conductance of the principal evacuation path 221 at the time the valve 205 stands full-open.

This system is operated in the following way.

The reactor 201, as the vacuum vessel, is opened and the processing object is put in the reactor 201. Then, the reactor 201 is closed. After the valve 204 is set closed, the evacuation conductance control valve 205 is set full-closed and the valve 206 is set closed, the vacuum pump 203 is actuated.

The valve 206 is set open and the valve 204 is set open, so that the inside of the reactor 201 is started to be evacuated. Thus, the inside of the reactor 201 is evacuated on.

Here, the conductance of the by-pass evacuation path 220 is sufficiently smaller than the conductance of the principal evacuation path 221, and hence the pressure reduction rate immediately after the start of evacuation does not become so high as to cause the particles to fly up.

Incidentally, if on the other hand the valve 206 is suddenly opened while the valve 204 of the by-pass evacuation path 220 stands closed and the evacuation conductance control valve 205 of the principal evacuation path stands full-open, the pressure reduction rate immediately after the start of evacuation becomes so abruptly high as to cause the particles to fly up.

Return to the main subject. After the evacuation is continued through the by-pass evacuation path 220 for a certain time, the movable valve element of the evacuation conductance control valve 205 is gradually opened by means of the stepping motor. Thus, the conductance of the valve 205 also gradually becomes greater.

The movable valve element of the valve 205 may be started to be opened at such a timing that the pressure reduction rate immediately after the start of opening the valve 205 is 1.5 times or less the pressure reduction rate immediately after the start of evacuation through the by-pass evacuation path.

The timing at which the valve 205 is started to be opened may more preferably be so adjusted that the pressure reduction rate immediately after the start of opening the valve 205 comes to be not higher than the pressure reduction rate immediately after the start of evacuation through the by-pass evacuation path.

In order to make the total evacuation time much shorter, the timing at which the valve 205 is started to be opened may be so determined that the pressure reduction rate immediately before the start of opening the valve 205 comes to be 0.2 times or more the pressure reduction rate immediately after the start of evacuation through the by-pass evacuation path.

It is preferable to precisely control the movement of the valve element of the evacuation conductance control valve so that the pressure reduction rate can be constant immediately after the start of evacuation until a certain time lapses. More specifically, the conductance of the evacuation conductance control valve may be gradually so increased that it substantially satisfies:

$$C(t)=V/(t_1-t)$$

where the conductance of the evacuation path at a certain time t is represented by C (t), the volume of the vacuum vessel by V, and the evacuation target time by $t_1$.

Figure 5:
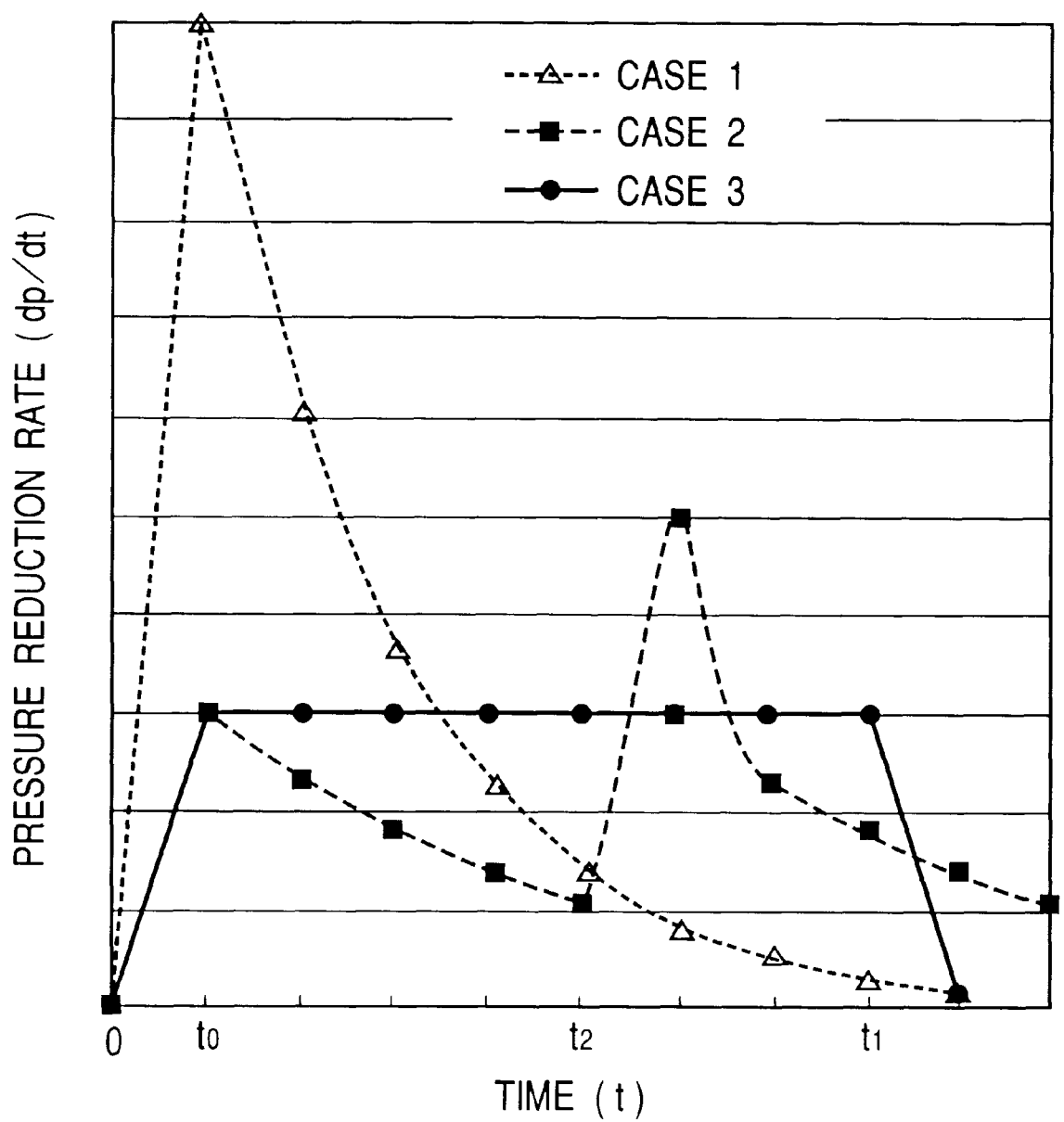
FIG. 5 is a graph showing an example of time dependence of pressure reduction rate (a pressure reduction rate curve).
Figure 17:
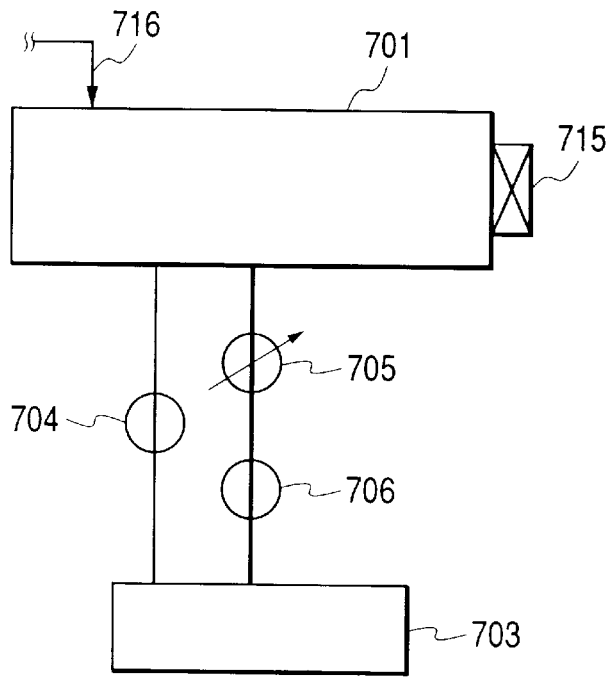
FIG. 17 is a diagrammatic illustration of another example of a conventional vacuum system.

FIG. 5 shows how the pressure reduction rate dp/dt changes with time. For example, using the system shown in FIG. 17, the valve 704 is closed and the evacuation conductance control valve 705 is full-opened (at a maximum conductance), in the state of which the valve 706 is opened, where the pressure reduction rate changes as shown by a line with blank triangles (Case 1).

In Case 1, the pressure reduction rate reaches a maximum at $t_0$ immediately after the start of evacuation and thereafter decreases with time.

As another example, using the system shown in FIG. 4, the valve 205 is full-closed, the valve 206 is opened and the valve 204 is closed, in the state of which the pump is actuated and the valve 204 is opened, and thereafter the valve 205 is instantaneously opened at time $t_2$ after an elapse of a predetermined time, where the pressure reduction rate changes as shown by a line with solid black quadrangles (Case 2).

In Case 2, the pressure reduction rate immediately after the valve 205 is opened (at $t_0$) is smaller than that of Case 1, but returns to a rate twice the same when the valve 205 is full-opened, so that it takes a very long time until the pressure reaches the target pressure.

On the other hand, using the system shown in FIG. 1, the valves 105 and 106 are closed, in the state of which the valve 106 is opened, and thereafter the valve 105 is gradually opened by means of the stepping motor, where the pressure reduction rate changes as shown by a line with solid black circles (Case 3).

In Case 3, the inside of the reactor is so evacuated as to satisfy C (t)=V/($t_1$−t) from $t_0$ up to $t_1$, i.e., at a constant pressure reduction rate, and hence the pressure reduction rate by no means abruptly increases and also the pressure reaches the target pressure in a short time.

To carry out the evacuation by the process of Case 3 in FIG. 5 and by the use of the system shown in FIG. 1, a high-precision evacuation conductance control valve and a high-precision stepping motor are required, resulting in an expensive system. Accordingly, using the system as shown in FIG. 4, the mode may be used in which the conductance of the evacuation conductance control valve 205 is gradually increased, whereby the system can be made inexpensive.

Figure 6:
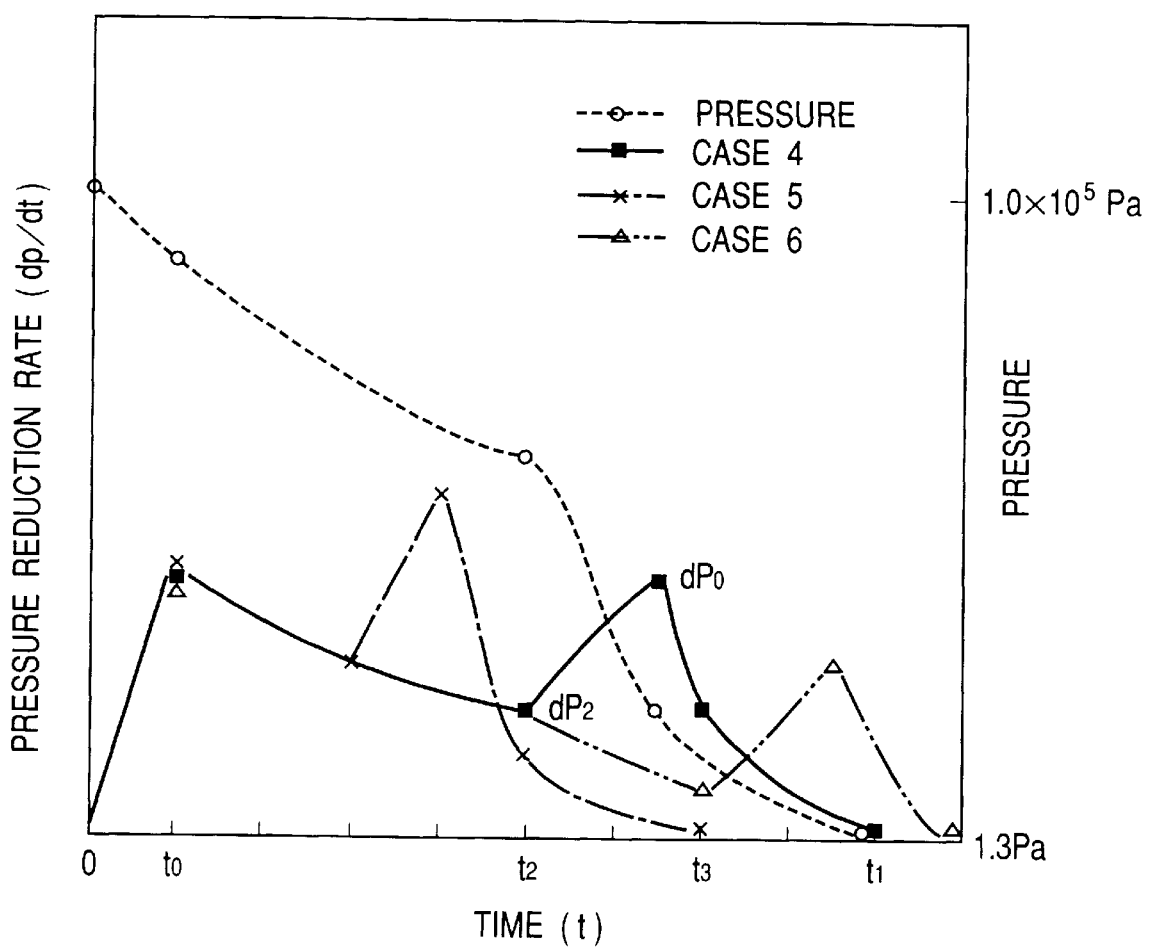
FIG. 6 is a graph showing an example of time dependence of pressure reduction rate (a pressure reduction rate curve) according to a preferred embodiment of the present invention.
Figure 7:
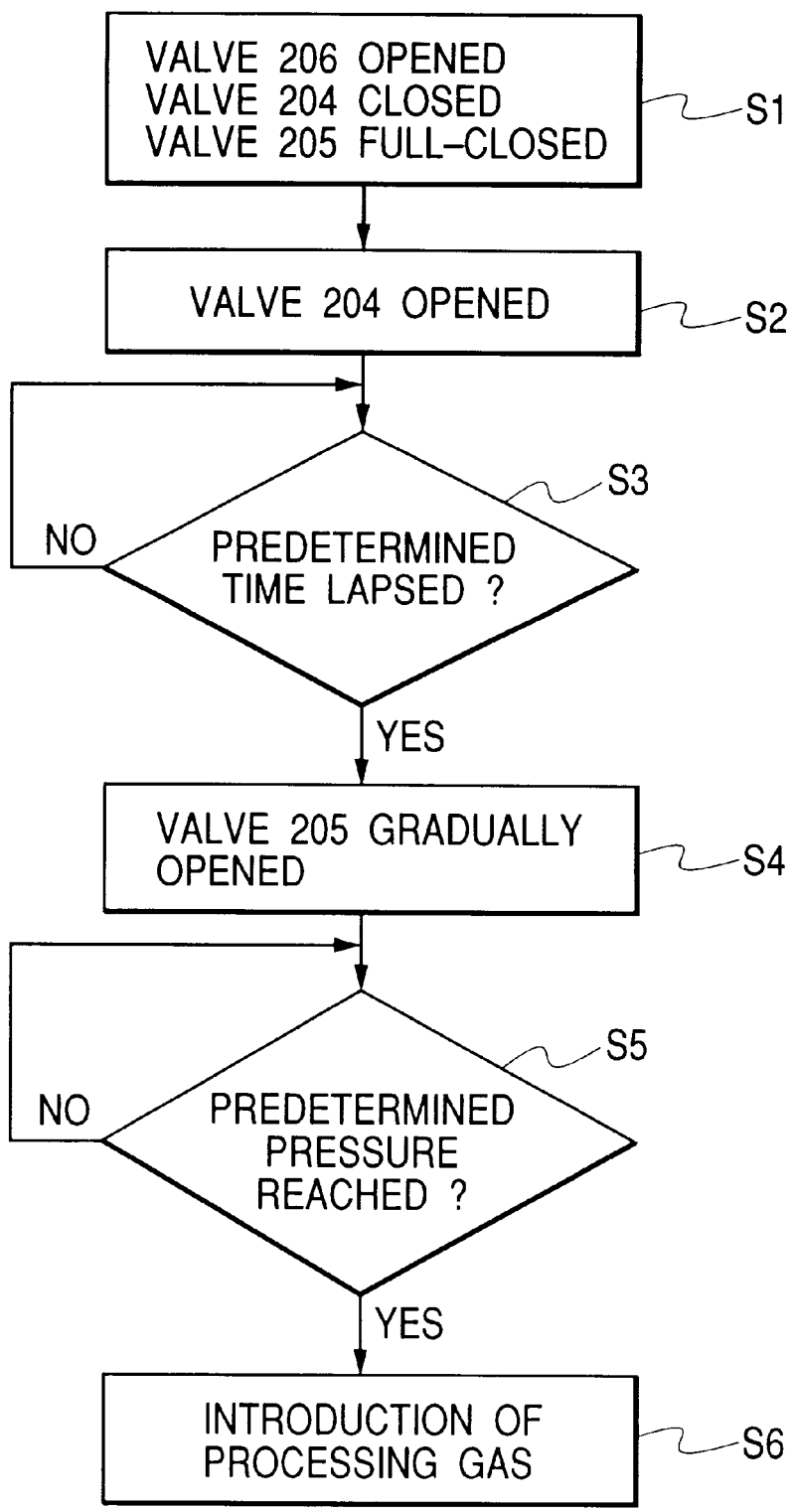
FIG. 7 is a flow chart of an evacuation process according to a preferred embodiment of the present invention.

FIG. 6 shows how the pressure reduction rate dp/dt changes with time in the evacuation process employing the system shown in FIG. 4. FIG. 7 is a flow chart of the operation of evacuation.

As shown in FIG. 7 by S1, the valve 206 is opened, the valve 204 is closed and the evacuation conductance control valve 205 is full-closed, in the state of which the inside of the vacuum vessel standing at atmospheric pressure is evacuated in the following way, so that a pressure reduction rate curve shown in FIG. 6 as Case 4 (a line with solid black quadrangles) is obtained. The pressure inside the vacuum vessel in this state is as shown by a line with blank circles.

The by-pass evacuation valve 204 is opened, and the inside of the vacuum vessel is started to be evacuated through the by-pass evacuation path 220 (S2). After the time $t_0$ immediately after the start of evacuation and at the time $t_2$ after an elapse of a predetermined time, the evacuation conductance control valve 205 is started to be opened (S4). Then, the pressure reduction rate gradually increases. Thus, the evacuation curve comes to have a minimum value ($dP_2$) and a maximum value ($dP_0$).

If the timing at which the valve 205 of the principal evacuation path 221 is started to be opened is set earlier than the time $t_2$, the pressure reaches the target pressure at the time $t_3$ as shown by Case 5 (a line with x-marks), but results in a value greater than the value at the time $t_0$ given immediately after the start of evacuation.

If, on the other hand, the timing at which the valve 205 is started to be opened is set later than the time $t_2$, i.e., $t_3$, the maximum value becomes smaller than the value given immediately after the start of evacuation as shown by Case 6 (a line with blank triangles), but the time at which the pressure reaches the target pressure (herein often "target-reaching time") becomes later than the time $t_1$. Accordingly, the valve 205 may be started to be so opened that the maximum value ($dP_0$) of the pressure reduction rate may not exceed 1.5 times the value given immediately after the start of evacuation, whereby the maximum pressure reduction rate can be made smaller than, e.g., $4.0 \times 10^4$ Pa/sec, and preferably $2.7 \times 10^4$ Pa/sec. Thus, the particles can be well prevented from flying up.

The valve 205 may also be started to be so opened that the minimum value ($dP_2$) of the pressure reduction rate may not be smaller than 0.2 times the value given immediately after the start of evacuation, thus, the time by which the target-reaching time can be made not long.

An example in which the target-reaching time is made shorter is Case 5 shown in FIG. 6. An example in which the maximum value ($dP_0$) of the pressure reduction rate may not exceed the value given immediately after the start of evacuation is Case 6.

Then, the conductance of the valve 205 may be gradually increased, thus the slope of the pressure reduction rate from the minimum value to the maximum value can be made gentle. Accordingly, it becomes possible with ease to make the maximum value not greater than the value given immediately after the start of evacuation. In particular, the time at which the conductance of the valve 205 becomes maximum may be so set as to be later than the target-reaching time.

For example, in Case 4, the conductance of the valve 205 may be gradually so increased that the pressure reaches the target pressure in the middle of the course where the valve 205 is still being opened at the time $t_1$, i.e., in the middle of the course where the conductance of the valve is being increased. Stated specifically, in an instance where the conductance of the by-pass evacuation path at the time the valve is opened is set 1/10 or less of the conductance of the principal evacuation path at the time the valve is full-opened, and the pressure reduction rate immediately after the valve of the by-pass evacuation path is set at $2.7 \times 10^4$ Pa/second, the time taken after the start of opening the evacuation conductance control valve and before the valve is full-opened may be set at 4 to 7 seconds. When set in this way, the time necessary for evacuating the inside of a 12-liter vessel in the state of atmospheric pressure until it has a pressure of 1.3 Pa (i.e., the target-reaching time) can be about 8 seconds and also the maximum pressure reduction rate by no means exceed $2.7 \times 10^4$ Pa/second.

So long as the maximum value does not exceed the value ($dP_i$) given immediately after the start of evacuation, the maximum pressure reduction rate can be determined by the conductance of the by-pass evacuation path, and hence the movement of particles such that particles fly up during evacuation can be prevented. It is preferable that the value ($dP_i$) is not more than $4.0 \times 10^4$ Pa/second.

After the pressure reaches the target pressure in this way, the processing gases are introduced into the vacuum vessel as shown by S6 in FIG. 7.

An evacuation system that can obtain the pressure reduction rate curve as shown in FIG. 6 without using any by-pass evacuation path will be described below.

Figure 8A:
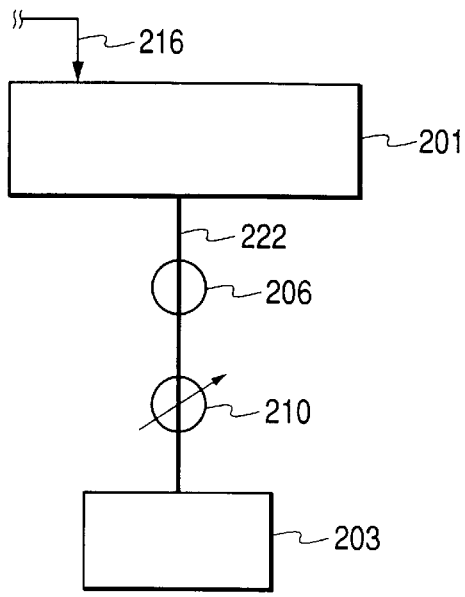
FIGS. 8A and 8B are diagrammatic illustrations of an evacuation system and an evacuation conductance control valve, according to another embodiment of the present invention.
Figure 8B:
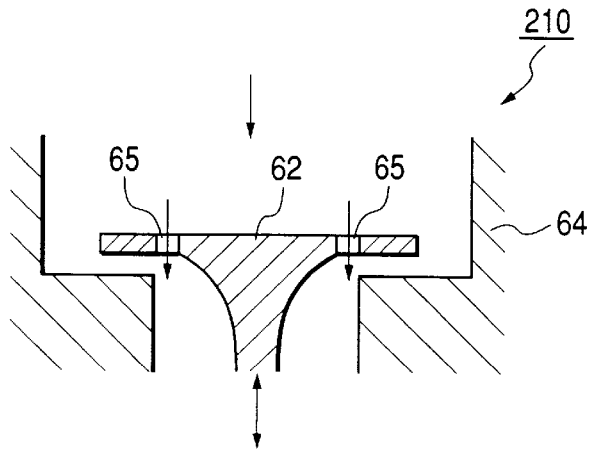

FIG. 8A illustrates another evacuation system according to the present invention. In this apparatus, a valve having through-holes 65 in a movable valve element 62 as shown in FIG. 8B is used as an evacuation conductance control valve 210 provided in an evacuation path 222.

Since the movable valve element 62 has the through-holes 65, the evacuation path can have the predetermined conductance even when the valve element 62 is brought into close contact with a flow path wall 64. That is, this system is characterized by through-holes 65 that are made to have the function shared by the by-pass evacuation path. Of course, the through-holes may be formed in the valve element of each of the valves shown in FIG. 2, and such a valve may be employed in the system shown in FIG. 8A.

The evacuation process and evacuation system according to the present invention can be applied to all types of vacuum systems that are accompanied with the evacuation started in the state of atmospheric pressure. In particular, the present invention is effective for systems in which the evacuation started in the state of atmospheric pressure is frequently carried out, as exemplified by open-to-air type vacuum systems such as ashing systems and cleaning systems, and for the evacuation of load-lock chambers of load-lock type vacuum systems.

Figure 9:
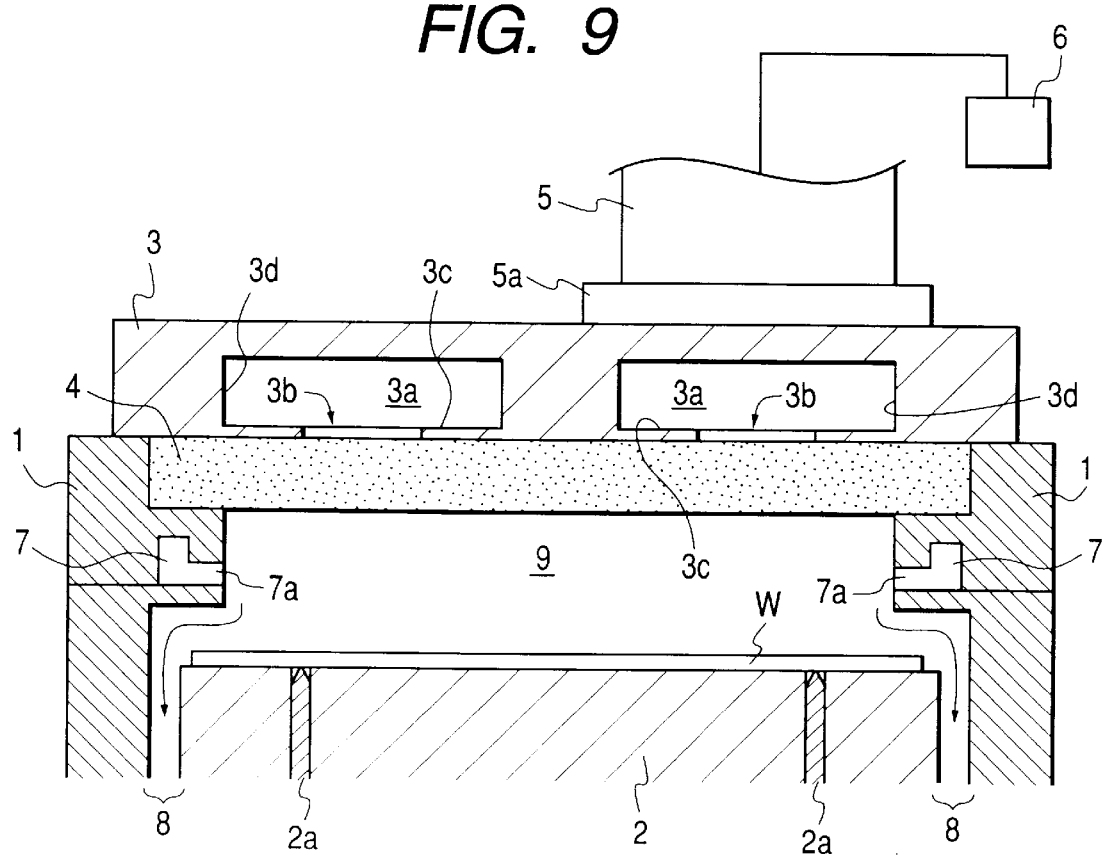
FIG. 9 is a diagrammatic cross section showing an example of a vacuum system used in the present invention.

FIG. 9 is a diagrammatic cross section showing a plasma treatment system as the vacuum system used in the present invention.

Reference numeral 1 denotes a vacuum vessel that can hold a processing object W in its inside and can generate plasma in its inside, and is an open-to-air type vessel.

Reference numeral 2 denotes a processing object holding means for holding and supporting the processing object W inside the vacuum vessel 1, and has lift pins 2a that can put up and down the processing object W.

Reference numeral 3 denotes a microwave feeding means for feeding microwave energy that causes the plasma to take place in the vacuum vessel 1.

Reference numeral 4 denotes a microwave-transmitting window that hermetically seals the inside of the vacuum vessel 1 and also allows microwaves to pass through it.

Reference numeral 5 denotes a microwave waveguide; and 6, a microwave source.

Reference numeral 7 denotes a gas feed path through which processing gases to be formed into plasma are fed and which has a plurality of gas discharge outlets 7a.

Reference numeral 8 denotes an evacuation path through which the inside of the vacuum vessel 1 is evacuated and which communictates with the evacuation system of the present invention.

A plasma treatment process that employs the system shown in FIG. 9 is carried out in the following way.

Processing gases are fed through the gas feed path 7 to the inside of the vacuum vessel 1, which has been evacuated to have a predetermined pressure. The processing gases are emitted to a space 9 and are thereafter flowed on toward the evacuation path 8. Meanwhile, microwaves generated in the microwave source 6 are propagated through a coaxial waveguide, cylindrical waveguide or rectangular waveguide 5 and are fed into the microwave feeding means 3. The microwaves are propagated in an endless ring-shaped guide path 3a of the microwave feeding means 3.

In the H-face 3c of the endless ring-shaped guide path 3a, longitudinal slots 3b crossing the traveling direction of microwaves are provided, and the microwaves are emitted through the slots 3b toward the space 9. The microwaves pass through the microwave-transmitting window 4 and are fed into the space 9.

Inside the space 9, processing gases are present, and the processing gases are excited by the microwaves to generate plasma. The surface of the processing object W is treated by utilizing this plasma.

Figure 10:
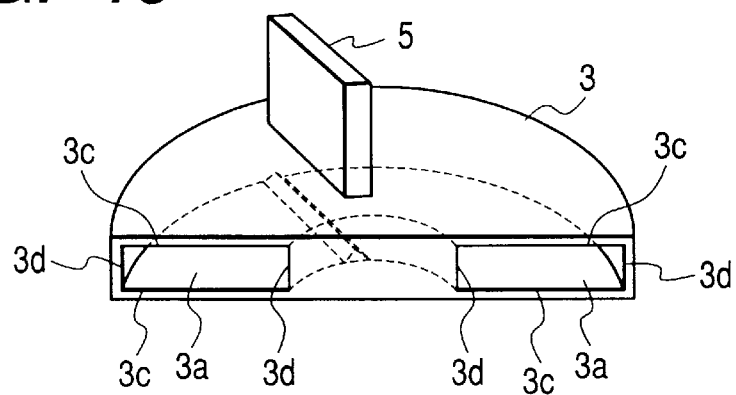
FIG. 10 is a diagrammatic illustration of a microwave feeding means of the vacuum system shown in FIG. 9.

FIG. 10 is a diagrammatic illustration of the appearance and cross section of the microwave feeding means 3.

Figure 11:
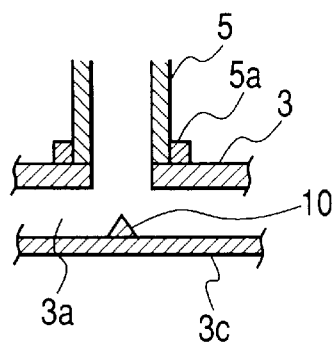
FIG. 11 is a diagrammatic illustration of a structure of the part where a waveguide is connected with the microwave feeding means of the vacuum system shown in FIG. 9.

FIG. 11 is a cross section of the part where the microwave waveguide 5 is connected with the microwave feeding means 3.

Figure 12:
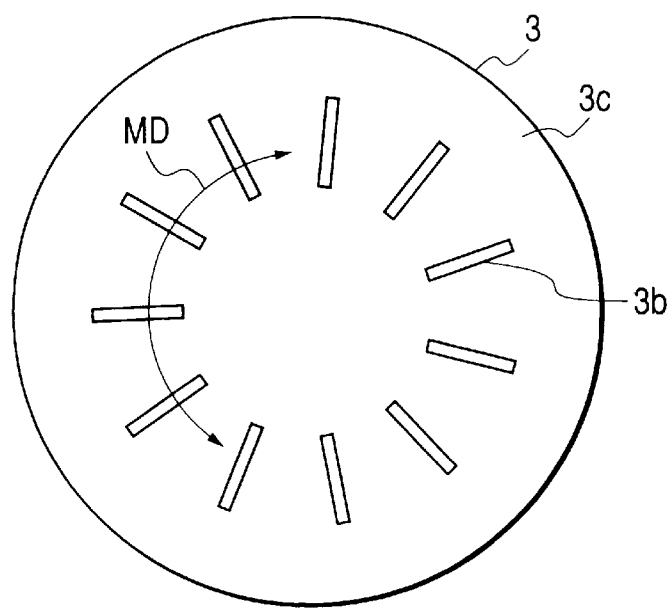
FIG. 12 is a diagrammatic illustration of a structure of slots provided in the microwave feeding means of the vacuum system shown in FIG. 9.

FIG. 12 is an illustration of the microwave feeding means 3 as viewed on its bottom at the part of the H-face 3c provided with the slots 3b.

The microwave feeding means 3 shown in FIG. 9 is equivalent to a rectangular waveguide which is so bent that the E-face 3d of the waveguide is curved into a ring. Thus, two H-faces 3c facing each other are both present on the same plane.

The microwaves having been propagated through the waveguide 5 are distributed in the directions different from each other by means of a microwave distributor 10 provided at the connecting part. The microwaves propagated in the endless ring-shaped guide path 3a are propagated while being emitted through the slots 3b extending in the direction crossing the traveling direction MD of the microwaves.

Such a microwave feeding means is called a planar slotted ring-type waveguide or a planar multi-slot antenna (PMA).

Inside the endless ring-shaped guide path 3a, the microwaves are traveled and propagated while undergoing attenuation due to the liberation of energy from the slots. In addition, since the microwaves are bidirectionally traveled, the traveling microwaves interfere with each other, whereby microwaves with a uniform intensity are emitted into the space 9.

Figure 13:
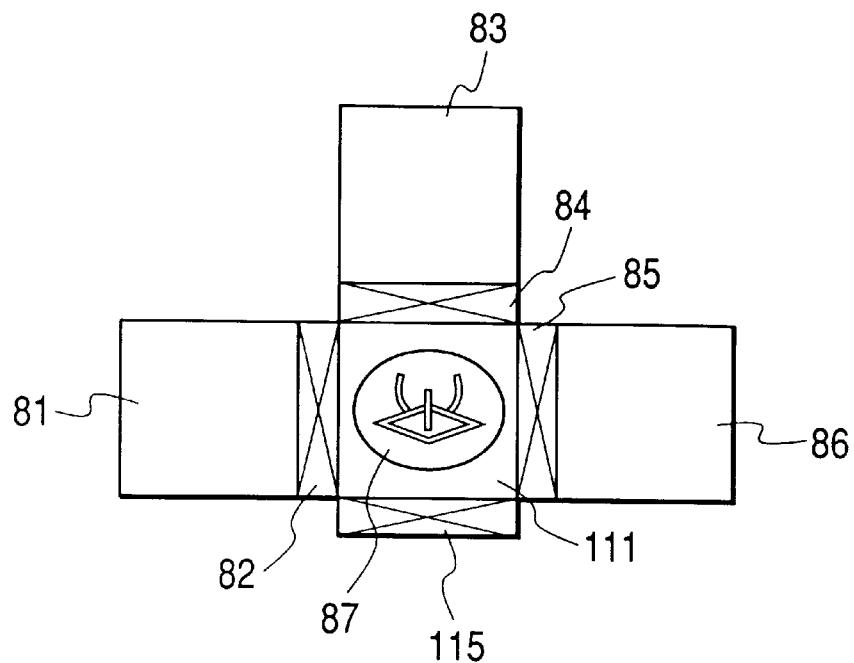
FIG. 13 is a diagrammatic illustration of a vacuum system having a load-lock chamber to which the present invention can be applied.

FIG. 13 is a diagrammatic illustration of a multi-chamber type processing system having a load-lock chamber 111 that can be evacuated by the evacuation system of the present invention. Reference numeral 111 denotes the load-lock chamber, which is a vacuum vessel that can be opened to the atmosphere by opening the gate valve 115 and can be kept from the atmosphere by closing it. The load-lock chamber 111 optionally holds a transport robot 87 for transporting processing objects.

Processing chambers 81, 83 and 86 are joined to the load-lock chamber 111 through gate valves 82, 84 and 85, respectively. In the respective processing chambers 81, 83 and 86, film formation processing such as CVD and sputtering, unwanted-matter removal processing such as plasma cleaning and plasma etching and heat treatment are carried out.

The number of the processing chambers may vary in the range of from 1 to about 10, depending on processes employed for device fabrication.

The system shown in FIG. 13 is operated in the following way.

The gate valve 115 is opened, and the processing object is put into the load-lock chamber 111. At this stage, other gate valves 82, 84 and 85 are kept closed. The inside of the load-lock chamber 111 is evacuated by the evacuation process described above, until it has the target pressure.

The gate valve 82 is opened to make the processing chamber 81 communicate with the load-lock chamber 111, the former being kept at a predetermined pressure, and the processing object is transported by the robot 87 from the load-lock chamber 111 into the processing chamber 81. At this stage, the pressure in the processing chamber 81 is set substantially equal to that in the load-lock chamber 111 so that the particles can be kept from flying up.

Thereafter, necessary processing is carried out in the processing chamber 83 or 86 and then $N_2$, He, Ar, clean air or the like is introduced as a purge gas into the load-lock chamber 111 through a processing gas introducing means (not shown) to make the pressure in the load-lock chamber 111 close to atmospheric pressure. Thereafter, the valve 115 is opened to take the processed object out of the load-lock chamber 111.

The present invention may be applied to an evacuation system for such a load-lock chamber, whereby the inside of the load-lock chamber can be evacuated without making the particles fly up.

The evacuation process of the present invention will be described below in greater detail by giving Embodiments and Examples. The present invention is by no means limited to these Embodiments and Examples.

First Embodiment

Shown here is an example in which, using the evacuation system shown in FIG. 1 and the curved-wall type evacuation conductance control valve shown by reference numeral 4 in FIG. 2, the evacuation process of the present invention is carried out on the evacuation of the inside of a load-lock chamber of a plasma enhanced CVD system of the multi-chamber type as shown in FIG. 13.

The load-lock chamber has a volume of 8 liters.

A cassette which holds processing objects is transported into the load-lock chamber. The vacuum pump is actuated. The curved-wall type evacuation conductance control valve is set full-closed, and thereafter the evacuation valve is opened. Subsequently, the evacuation conductance control valve is gradually opened. Thus, the inside of the load-lock chamber is started to be evacuated in the state of atmospheric pressure. During this evacuation, the conductance of the evacuation conductance control valve is gradually increased so as to follow $C(t)=8/(5-t)$.

About 7 seconds after, a degree of vacuum of 0.01 Torr (about 1.33 Pa) or below is obtained. The processed object is transported into a CVD reactor similar to the processing chamber 81 shown in FIG. 13 to form a thin film.

The resultant throughput is 65 wafers/hour. Compared with a throughput of 62 wafers/hour in an instance where the conventional evacuation process is used to carry out the evacuation, a productivity of 5% gain is achieved.

Second Embodiment

Shown here is an example in which, using the evacuation system shown in FIG. 1 and the gradually enlarged opening type evacuation conductance control valve shown by reference numeral 5 in FIG. 2, the evacuation process of the present invention is carried out on the evacuation of the inside of a load-lock chamber of a sputtering system of the multi-chamber type as shown in FIG. 13.

A reactor as the load-lock chamber has a volume of 8 liters.

A cassette which holds processing objects is transported into the load-lock chamber. The vacuum pump is actuated. The gradually enlarged opening type evacuation conductance control valve is set full-closed, and thereafter the evacuation valve is opened. Subsequently, the evacuation conductance control valve is gradually opened. Thus, the inside of the load-lock chamber is started to be evacuated in the state of atmospheric pressure. During this evacuation, the conductance of the evacuation conductance control valve is gradually increased so as to follow $C(t)=8/(5-t)$.

About 7 seconds after, a degree of vacuum of 0.01 Torr (about 1.33 Pa) or below is obtained. The processed object is transported into a sputtering reactor similar to the processing chamber 81 shown in FIG. 13 to form a thin film.

The resultant throughput is 85 wafers/hour. Compared with a throughput of 82 wafers/hour in an instance where the conventional evacuation process is used to carry out the evacuation, a productivity of 4% gain is achieved.

Third Embodiment

Shown here is an example in which, using the evacuation system shown in FIG. 1 and the curved valve element type evacuation conductance control valve shown by reference numeral 3 in FIG. 2, the evacuation process of the present invention is carried out on the evacuation of the inside of a load-lock chamber of a CVD system used to deposit a metal.

A reactor as the load-lock chamber has a volume of 8 liters.

A cassette which holds processing objects is transported into the load-lock chamber. The vacuum pump is actuated. The curved valve element type evacuation conductance control valve is set full-closed, and thereafter the evacuation valve is opened. Subsequently, the evacuation conductance control valve is gradually opened. Thus, the inside of the load-lock chamber is started to be evacuated in the state of atmospheric pressure. During this evacuation, the conductance of the evacuation conductance control valve is gradually increased so as to follow $C(t)=8/(5-t)$.

About 7 seconds after, a degree of vacuum of 0.01 Torr (about 1.33 Pa) or below is obtained. Thereafter, gases of organic metal compounds are introduced into the reactor, and the processed object is transported into a CVD reactor to form a metal film.

The resultant throughput is 85 wafers/hour. Compared with a throughput of 82 wafers/hour in an instance where the conventional evacuation process is used to carry out the evacuation, a productivity of 4% gain is achieved.

In the foregoing, the evacuation system shown in FIG. 1 is used to evacuate the load-lock chamber. The load-lock chamber may also be evacuated using the evacuation system shown in FIG. 4.

EXAMPLE 1

Shown here is an example in which, using the evacuation system shown in FIG. 1 and the evacuation conductance control valve shown by reference numeral 1 in FIG. 2, the evacuation process of the present invention is carried out on the ashing of a photoresist after the processing object is dry-etched. The rotational angular velocity of the evacuation conductance control valve is controllable with a stepping motor.

An ashing reactor 101 used here had a volume of 12 liters.

The processing object was transported into the ashing reactor 101. As the processing object, a silicon substrate (a silicon wafer of 8 inches in diameter) was used immediately after its interlayer $SiO_2$ film was etched to form through holes. The vacuum pump 103 was actuated. The rotational angular velocity control type evacuation conductance control valve 105 was set full-closed, and thereafter the evacuation valve 106 was opened. Subsequently, the valve 105 was gradually opened. Thus, the inside of the ashing reactor 101 was started to be evacuated in the state of atmospheric pressure. During this evacuation, the conductance of the valve 105 was gradually increased so as to be C (t)=12/(6−t). Here, C (t) is conductance, and t is evacuation time.

About 8 seconds after, a degree of vacuum of 0.01 Torr (about 1.33 Pa) or below was obtained.

Next, oxygen gas was introduced into the ashing reactor 101 at a flow rate of 2 slm through the processing gas introducing means 116 and the pressure was kept at 1 Torr (about 133 Pa). Into this ashing reactor 101, a power of 1.5 kW was fed from a 2.45 GHz microwave power source through the planar slotted ring-type waveguide, to thereby cause plasma to take place in the ashing reactor 101. Here, the oxygen gas was excited, decomposed and reacted in the ashing reactor 101 to become ozone, and was transported toward the silicon substrate, where the photoresist left on the substrate was oxidized and was removed by vaporization. After the ashing, the ashing rate, substrate surface electric-charge density and so forth were evaluated.

The ashing rate attained was as great as 8.6 $\mu$m/min plus-minus 8.5%, and the substrate surface electric-charge density was at a sufficiently low value of $-1.3 \times 10^{11}/cm^2$. Throughput was 150 wafers/hour. Compared with a throughput of 121 wafers/hour in an instance where the conventional evacuation process was used to carry out the evacuation, a productivity of 24% gain was achieved.

EXAMPLE 2

Shown here is an example in which, using the evacuation system shown in FIG. 1 and the valve element moving-speed control type evacuation conductance control valve shown by reference numeral 2 in FIG. 2, the evacuation process of the present invention is carried out on the ashing of a photoresist after the processing object is dry-etched.

An ashing reactor 101 used here had a volume of 10 liters.

The processing object was transported into the ashing reactor 101. As the processing object, a silicon substrate (a silicon wafer of 8 inches in diameter) was used immediately after its interlayer $SiO_2$ film was etched to form through holes. The vacuum pump 103 was actuated. The valve element moving-speed control type evacuation conductance control valve 105 was set full-closed, and thereafter the evacuation valve 106 was opened. Subsequently, the valve 105 was gradually opened. This the inside of the ashing reactor 101 was started to be evacuated in the state of atmospheric pressure. During this evacuation, the conductance of the valve 105 was gradually increased so as to be C (t)=10/(5−t).

About 7 seconds after, a degree of vacuum of 0.01 Torr (about 1.33 Pa) or below was obtained.

Next, oxygen gas was introduced into the ashing reactor 101 at a flow rate of 1 slm through the processing gas introducing means 116 and the pressure was kept at 1 Torr (about 133 Pa). Into this ashing reactor 101, a power of 1.5 kW was fed from a 2.45 GHz microwave power source through the planar slotted ring-type waveguide, to thereby cause plasma to take place in the ashing reactor 101. Here, the oxygen gas was excited, decomposed and reacted in the ashing reactor 101 to become ozone, and was transported toward the silicon substrate, where the photoresist left on the substrate was oxidized and was removed by vaporization. After the ashing, the ashing rate, substrate surface electric-charge density and so forth were evaluated.

The ashing rate attained was as great as 8.2 $\mu$m/min plus-minus 7.6%, and the substrate surface electric-charge density was at a sufficiently low value of $-1.2 \times 10^{11}/cm^2$. Throughput was 145 wafers/hour. Compared with a throughput of 121 wafers/hour in an instance where the conventional evacuation process was used to carry out the evacuation, a productivity of 20% gain was achieved.

EXAMPLE 3

Shown here is an example in which, using the evacuation system shown in FIG. 1 and the evacuation conductance control valve shown by reference numeral 1 in FIG. 2, the evacuation process of the present invention is carried out on the ashing of a photoresist after ion implantation. The rotational angular velocity of the evacuation conductance control valve is controllable with a stepping motor.

An ashing reactor 101 used here had a volume of 10 liters.

The processing object was transported into the ashing reactor 101. As the processing object, a silicon substrate (a silicon wafer of 8 inches in diameter) was used immediately after As ions were implanted after gate electrodes were formed. The vacuum pump 103 was actuated. The rotational angular velocity control type evacuation conductance control valve 105 was set full-closed, and thereafter the evacuation valve 106 was opened. Subsequently, the valve 105 was gradually opened. Thus the inside of the ashing reactor 101 was started to be evacuated in the state of atmospheric pressure. During this evacuation, the conductance of the valve 105 was gradually increased so as to be C (t)=10/(5−t).

About 7 seconds after, a degree of vacuum of 0.01 Torr (about 1.33 Pa) or below was obtained.

Next, oxygen gas was introduced into the ashing reactor 101 at a flow rate of 1 slm through the processing gas introducing means 116 and the pressure was kept at 1 Torr (about 133 Pa). Into this ashing reactor 101, a power of 1.5 kW was fed from a 2.45 GHz microwave power source through the planar slotted ring-type waveguide, to thereby cause plasma to take place in the ashing reactor 101. Here, the oxygen gas was excited, decomposed and reacted in the ashing reactor 101 to become ozone, and was transported toward the silicon substrate, where the photoresist left on the substrate was oxidized and was removed by vaporization. After the ashing, the ashing rate, substrate surface electric-charge density and so forth were evaluated.

The ashing rate attained was as great as 5.2 $\mu$m/min plus-minus 9.2%, and the substrate surface electric-charge density was at a sufficiently low value of $-1.2 \times 10^{11}/cm^2$. Throughput was 88 wafers/hour. Compared with a throughput of 73 wafers/hour in an instance where the conventional evacuation process was used to carry out the evacuation, a productivity of 20% gain was achieved.

EXAMPLE 4

Shown here is an example in which, using the evacuation system shown in FIG. 4 and the vacuum system shown in FIGS. 9 to 12, the evacuation process of the present invention is carried out on the ashing of a photoresist left on a silicon wafer as a processing object.

As the valve 206, the evacuation conductance control valve 205 and the by-pass evacuation valve 204, a valve (V2-050-AK-225-CNV) manufactured by MKS Co., a variable-speed switch throttle valve (653B-2-50-1) manufactured by MKS Co. and a needle valve (FUBFN-91-12.7) manufactured by Fujikin K.K., respectively, were used. Also, as the vacuum pump, a dry pump manufactured by Arukateru K.K. was used.

Figure 14:
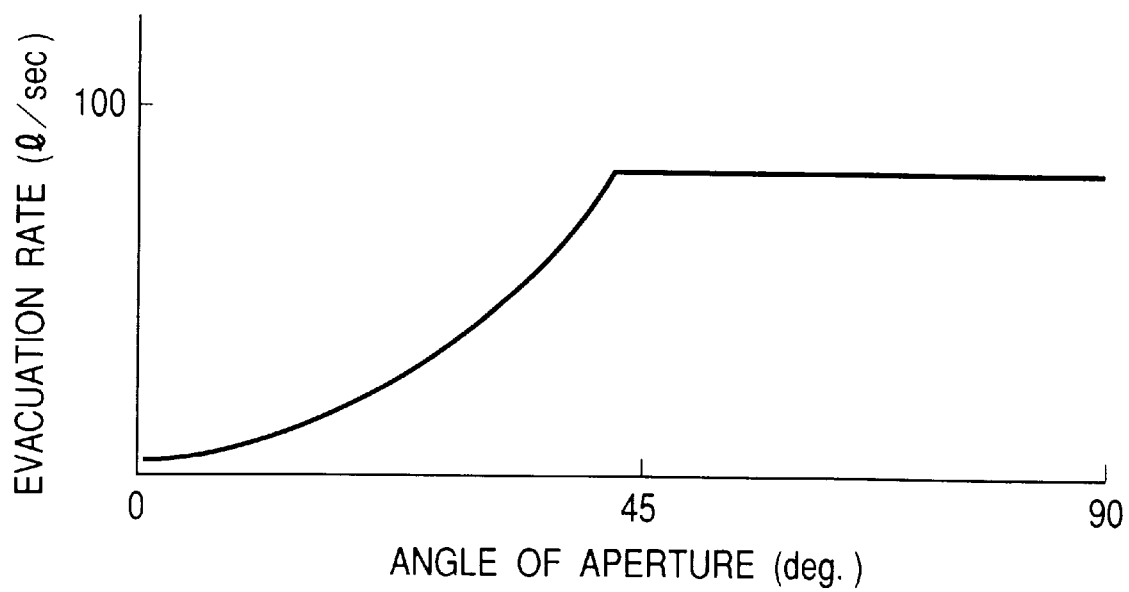
FIG. 14 is a graph showing valve-element aperture angle dependence of pressure reduction rate of the evacuation conductance control valve used in the present invention.

The relationship between the angle of the aperture of the variable valve element of the above throttle valve and the pressure reduction rate is shown in FIG. 14. As shown in FIG. 14, this valve can gradually increase the conductance in the range of angles of the aperture of from 0 degrees to 45 degrees.

The above throttle valve has a conductance variable in the range of from 0.7 liter/second to 300 liter/second. However, since the above dry pump has a pressure reduction rate of 84.4 liters/second as a maximum value, the conductance stands saturated at an angle of aperture of about 45 degrees.

As the ashing reactor (1 or 201), a vessel with a volume of 12 liters was used.

As the processing object, a silicon wafer of 8 inches (about 200 mm in diameter), having a cured photoresist thereon, was used.

The reactor 1 was opened, and the silicon wafer with the photoresist was placed on a holding means 2. Then, the reactor 1 was closed to hermetically seal its inside. Subsequently, the dry pump was actuated. The valve 204 was opened while keeping the valves 206 and 205 closed. Next, the valve 206 was opened to carry out slow evacuation for three seconds through the by-pass evacuation path 220.

Figure 15:
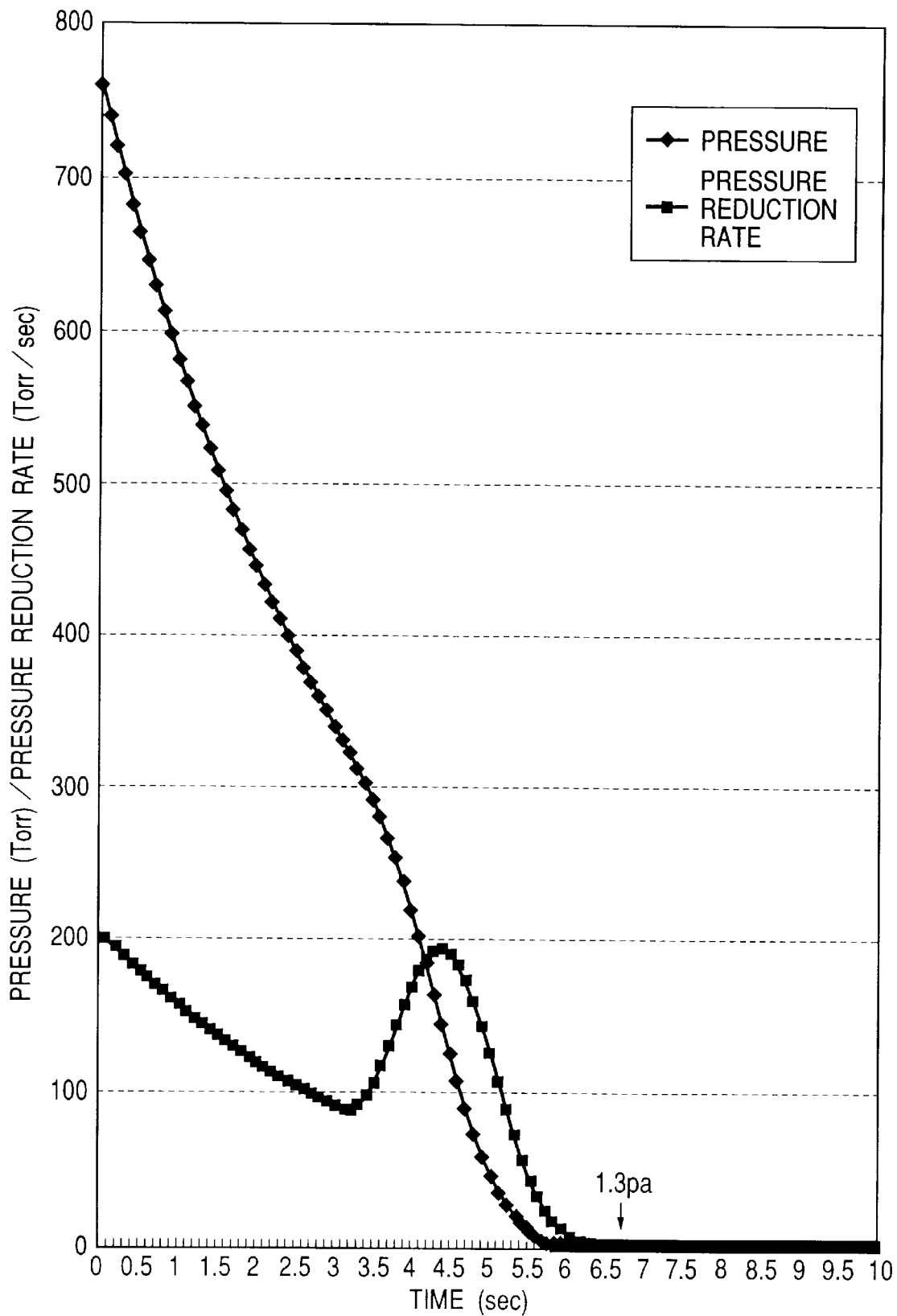
FIG. 15 is a graph showing an example of time dependence of pressure reduction rate (a pressure reduction rate curve) according to an embodiment of the present invention.
Figure 16:
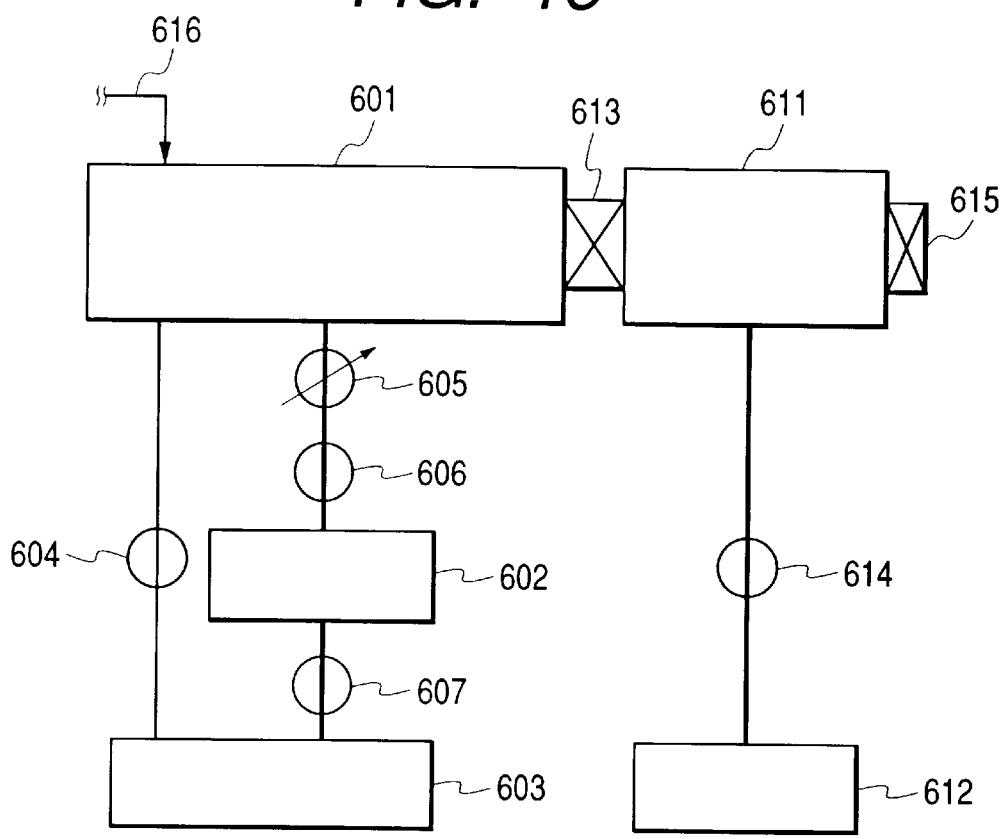
FIG. 16 is a diagrammatic illustration of an example of a conventional vacuum system.

Subsequently, the valve 205 was gradually opened at angles of aperture of from 0 degrees to 90 degrees over a period of 7 seconds. As a result, the inside of the reactor 1 was able to be evacuated to a pressure of about 1.3 Pa in 7 seconds. The pressure reduction rate and changes with time of internal pressure of the reactor, which were measured at this stage, were as shown in FIG. 15.

Here, when the inside of a vacuum vessel having a volume V (1) and an initial pressure Pi is evacuated at a pressure reduction rate S (l/sec), pressure P (t) inside the vacuum vessel after the start t (sec) of evacuation is represented by the following expression:

$$P(t) = P_i \exp[-(S/V)t]$$

and pressure reduction rate is represented by the following expression:

$$-dP/dt = [P(t) - P_i]/t.$$

At a step interval of 0.1 sec and using step calculation data obtained at a preceding step for each step, the pressure and the pressure reduction rate were calculated according to the above expressions, and the calculations were plotted with respect to time to determine a pressure reduction rate curve as shown in FIG. 15.

As shown in FIG. 15, the pressure reduction rate gradually decreases from 200 Torr/second (about $2.7 \times 10^4$ Pa/second) before the valve 205 is opened, and reaches a minimum value of about 90 Torr/second (about $1.2 \times 10^4$ Pa/second) immediately before the valve is opened.

At this stage, the pressure is about 300 Torr/second (about $4.0 \times 10^4$ Pa/second).

When the valve 205 is started to be opened, the pressure reduction rate gradually increases until it reaches a maximum value, and thereafter begins to again decrease. After it has reached the maximum value, the conductance of the principal evacuation path is sufficiently greater than that of the by-pass evacuation path, so that the pressure and pressure reduction rate abruptly drop to reach the target value 1.3 Pa in the course where the valve 205 is being opened (after about 7 seconds), and thereafter become saturated.

Next, oxygen gas was introduced into the ashing reactor 101 at a flow rate of 1 slm from the processing gas introducing means 116 through a mass flow controller, and the pressure inside the reactor was kept at about 133 Pa. Microwaves of 2.45 GHz were generated by the microwave power source, and the microwaves were fed into the reactor through the slots of the microwave feeding means shown in FIG. 9, to thereby cause glow discharge plasma to take place in the reactor.

In this way, with utilization of ozone produced by microwave excitation, the photoresist on the silicon wafer was ashed. The greater part of the photoresist thus ashed was discharged out of the reactor. Thus, the photoresist on the silicon wafer was removed.

The timing at which the throttle valve serving as the evacuation conductance control valve was started to be opened was changed, and the evacuation through the by-pass evacuation path was carried out for 4 seconds or 5 seconds. Thereafter, the throttle valve standing full-closed was gradually opened over a period of 5 seconds or 4 seconds until it became full-open. In both instances, the pressure was able to reach the target pressure in 7 or 8 seconds. Moreover, the maximum value of the pressure reduction rate did not become greater than the value given immediately after the start of evacuation (the initial value).

In place of the evacuation carried out through the by-pass evacuation path before the main evacuation, the evacuation equivalent to the by-pass evacuation was carried out for 3 to 5 seconds using the system as shown in FIGS. 8A and 8B, through the through-holes provided in the valve element. Thereafter, the evacuation conductance control valve was gradually opened in 4 to 7 seconds so as to gradually increase its conductance. In this instance, too, the similar pressure reduction rate curve as those shown in FIG. 6 or 15 was attained.

As described above, the conductance of the evacuation conductance control valve is gradually increased with an elapse of evacuation time, whereby a process and system that enable high-speed evacuation while preventing the particles from flying up can be provided.

What is claimed is:

1. A process for evacuating the inside of a vacuum vessel before a processing gas is introduced into the vacuum vessel, said process comprising the steps of:

a first step of evacuating the inside of the vacuum vessel through a by-pass evacuation path such that a pressure reduction rate of the pressure inside the vacuum vessel is gradually reduced immediately after the start of evacuation; and a second step of opening an evacuation conductance control valve, provided in a principal evacuation path, during or after the first step such that conductance of the evacuation conductance control valve is gradually increased with an elapse of evacuation time, wherein the timing at which the evacuation conductance control valve is started to be opened is controlled so that a pressure reduction rate curve of the pressure inside the vacuum vessel has a minimum value and a maximum value, the minimum value becoming 0.2 times or more a value given immediately after the start of evacuation and the maximum value becoming not greater than the value given immediately after the start of evacuation.

2. The process according to claim 1, wherein the maximum value of the pressure reduction rate of the pressure inside the vacuum vessel is at most $4.0 \times 10^4$ Pa/second.

3. The process according to claim 1, wherein the maximum value of the pressure reduction rate of the pressure inside the vacuum vessel is at most $2.7 \times 10^4$ Pa/second.

4. The process according to claim 1, wherein the pressure at the beginning of evacuation in the vacuum vessel is atmospheric pressure.

5. The process according to claim 1, wherein the evacuation conductance control valve comprises a rotary valve element, and further comprising controlling the rotational angular velocity thereof.

6. The process according to claim 1, wherein the evacuation conductance control valve comprises a rotary valve element the valve of which does not have a planar shape, and further comprising controlling the rotational angular velocity thereof so as to be substantially constant.

7. The process according to claim 1, wherein the evacuation conductance control valve comprises a movable valve element, and further comprising controlling the movement velocity thereof.

8. The process according to claim 1, wherein the evacuation conductance control valve comprises a movable valve element an opening of which is neither a rectangular shape nor a circular shape, and further comprising controlling the movement velocity thereof so as to be substantially constant.

9. The process according to claim 1, further comprising providing a valve different from the evacuation conductance control valve in series with the evacuation conductance control valve.

10. The process according to claim 1, further comprising introducing the processing gas into the vacuum vessel through a flow-rate controlling means after the internal pressure reaches a target pressure, and further comprising maintaining the pressure inside the vacuum vessel by controlling the evacuation conductance control valve.

11. The process according to claim 1, wherein the vacuum vessel is a load-lock chamber, and the processing gas is a purge gas.

12. A plasma treatment process comprising performing plasma treatment in the vacuum vessel having been evacuated by the evacuation process according to claim 1.

13. The plasma treatment process according to claim 12, wherein the plasma treatment is a microwave plasma treatment.

14. The plasma treatment process according to claim 12, wherein the plasma treatment is ashing.

15. The plasma treatment process according to claim 12, further comprising feeding microwave energy for generating plasma into the vacuum vessel from a plurality of slots provided on a planar H-face of an endless ring-shaped guide path, and holding a processing object facing the H-face.

16. A system for evacuating the inside of a vacuum vessel before a processing gas is introduced into the vacuum vessel, said system comprising:

a by-pass evacuation path for evacuating the inside of the vacuum vessel such that a pressure reduction rate of the pressure inside the vacuum vessel is gradually reduced immediately after the start of evacuation;

a principal evacuation path provided parallel to the by-pass evacuation path;

an evacuation conductance control valve provided in the principal evacuation path; and opening means for opening the evacuation conductance control valve during or after the evacuation by the by-pass evacuation path such that conductance of the evacuation conductance control valve is gradually increased with an elapse of evacuation time, wherein said opening means controls the timing at which the evacuation conductance control valve is started to be opened such that a pressure reduction rate curve of the pressure inside the vacuum vessel has a minimum value and a maximum value, the minimum value becoming 0.2 times or more a value given immediately after the start of evacuation and the maximum value becoming not greater than the value given immediately after the start of evacuation.

17. The system according to claim 16, wherein the maximum value of the pressure reduction rate of the pressure inside the vacuum vessel is controlled so as to be at most $4.0 \times 10^4$ Pa/second.

18. The system according to claim 16, wherein the maximum value of the pressure reduction rate of the pressure inside the vacuum vessel is controlled so as to be at most $2.7 \times 10^4$ Pa/second.

19. The system according to claim 16, wherein the vacuum vessel is open-to-air.

20. The system according to claim 16, wherein the evacuation conductance control valve comprises a rotary valve element, and said opening means controls the rotational angular velocity thereof.

21. The system according to claim 16, wherein the evacuation conductance control valve comprises a rotary valve element the valve of which does not have a planar shape, and said opening means controls the rotational angular velocity so as to be substantially constant.

22. The system according to claim 16, wherein the evacuation conductance control valve comprises a movable valve element, and said opening means controls the movement velocity thereof.

23. The system according to claim 16, wherein the evacuation conductance control valve comprises a movable valve element an opening of which is neither a rectangular shape nor a circular shape, and said opening means controls the movement velocity thereof so as to be substantially constant.

24. The system according to claim 16, further comprising a valve different from the evacuation conductance control valve in series with the evacuation conductance control valve.

25. The system according to claim 16, further comprising a controller by which, when the processing gas is introduced into the vacuum vessel through flow-rate controlling means after the internal pressure reaches a target pressure, the pressure inside the vacuum vessel is maintained by controlling the evacuation conductance control valve.

26. The system according to claim 16, wherein the vacuum vessel is a load-lock chamber, and the processing gas is a purge gas.

27. A plasma treatment system comprising means for performing plasma treatment in the vacuum vessel having been evacuated by the evacuation system according to claim 16.

28. The plasma treatment system according to claim 27, which further comprises microwave feeding means for feeding microwave energy for generating plasma.

29. The plasma treatment system according to claim 27, wherein the plasma treatment is ashing.

30. The plasma treatment system according to claim 27, further comprising microwave feeding means for feeding microwave energy for generating plasma into the vacuum vessel, said microwave feeding means comprising an endless ring-shaped guide path and a plurality of slots provided on a planar H-face of the endless ring-shaped guide path, and holding means for holding a processing object to face the H-face.

* * * * *

UNITED STATES PATENT AND TRADEMARK OFFICE
CERTIFICATE OF CORRECTION

PATENT NO. : 6,080,679
DATED : June 27, 2000
INVENTOR(S) : Nobumasa Suzuki

It is certified that error appears in the above-identified patent and that said Letters Patent is hereby corrected as shown below:

Column 8,
Line 37, "evacuation" should read -- evacuation; --;
Line 45, "increased, thus" should read -- increased; thus, --.

Column 9,
Line 3, "exceed" should read -- can exceed --;
Line 52, "plasma to take" should read -- plasma to be --;
Line 53, "place" should read -- generated --;
Line 64, "communictates" should read -- communicates --.

Column 13,
Line 55, "This the" should read -- Thus, the --.

Signed and Sealed this

Twenty-third Day of October, 2001

Attest:

NICHOLAS P. GODICI
*Attesting Officer*  *Acting Director of the United States Patent and Trademark Office*